United States Patent [19]

Heep et al.

[11] Patent Number: 5,331,450
[45] Date of Patent: Jul. 19, 1994

[54] INFRARED TRANSMITTER AND RECEIVER AND METHOD

[75] Inventors: Jerry J. Heep, Weatherford; Steven S. Erickson, Fort Worth, both of Tex.

[73] Assignee: AST Research, Inc., Irvine, Calif.

[21] Appl. No.: 818,633

[22] Filed: Jan. 6, 1992

[51] Int. Cl.⁵ .................. H04J 14/08; H04J 3/00; H04Q 11/00
[52] U.S. Cl. .................. 359/135; 359/140; 359/146; 370/77; 340/825.53
[58] Field of Search .................. 359/135–140, 359/142, 144, 146, 147, 148; 358/194.1; 340/825.5, 825.53; 370/77

[56] References Cited

U.S. PATENT DOCUMENTS

| | | | |
|---|---|---|---|
| 4,151,407 | 4/1979 | McBride | 359/146 |
| 4,313,227 | 1/1982 | Eder | 359/181 |
| 4,325,146 | 4/1982 | Lennington | 359/155 |
| 4,337,480 | 6/1982 | Bourassin et al. | 359/145 |
| 4,356,509 | 10/1982 | Skerlos | 359/146 |
| 4,626,848 | 12/1986 | Ehlers | 359/148 |
| 4,701,909 | 10/1987 | Kavehard | 359/136 |
| 4,769,643 | 9/1988 | Sogame | 359/148 |
| 5,128,792 | 7/1992 | Teich | 359/158 |

OTHER PUBLICATIONS

Acclaim Entertainment, Inc. Double Player Wireless Sytem.
Dance, "Multichannel Remote Control Systems", Electronics #153, 11-78 pp. 33-34, 37.

Primary Examiner—Leslie Pascal
Attorney, Agent, or Firm—Keith Hargrove

[57] ABSTRACT

An infrared remote-control system and method for the simultaneous transmission of data from two or more separate hand transmitters to a single remote-control receiver is disclosed. Interference between transmitted signals is eliminated by interlacing control signals with quiescent periods during transmission. The control signals are received and validated by the receiver based on the quiescent periods.

20 Claims, 6 Drawing Sheets

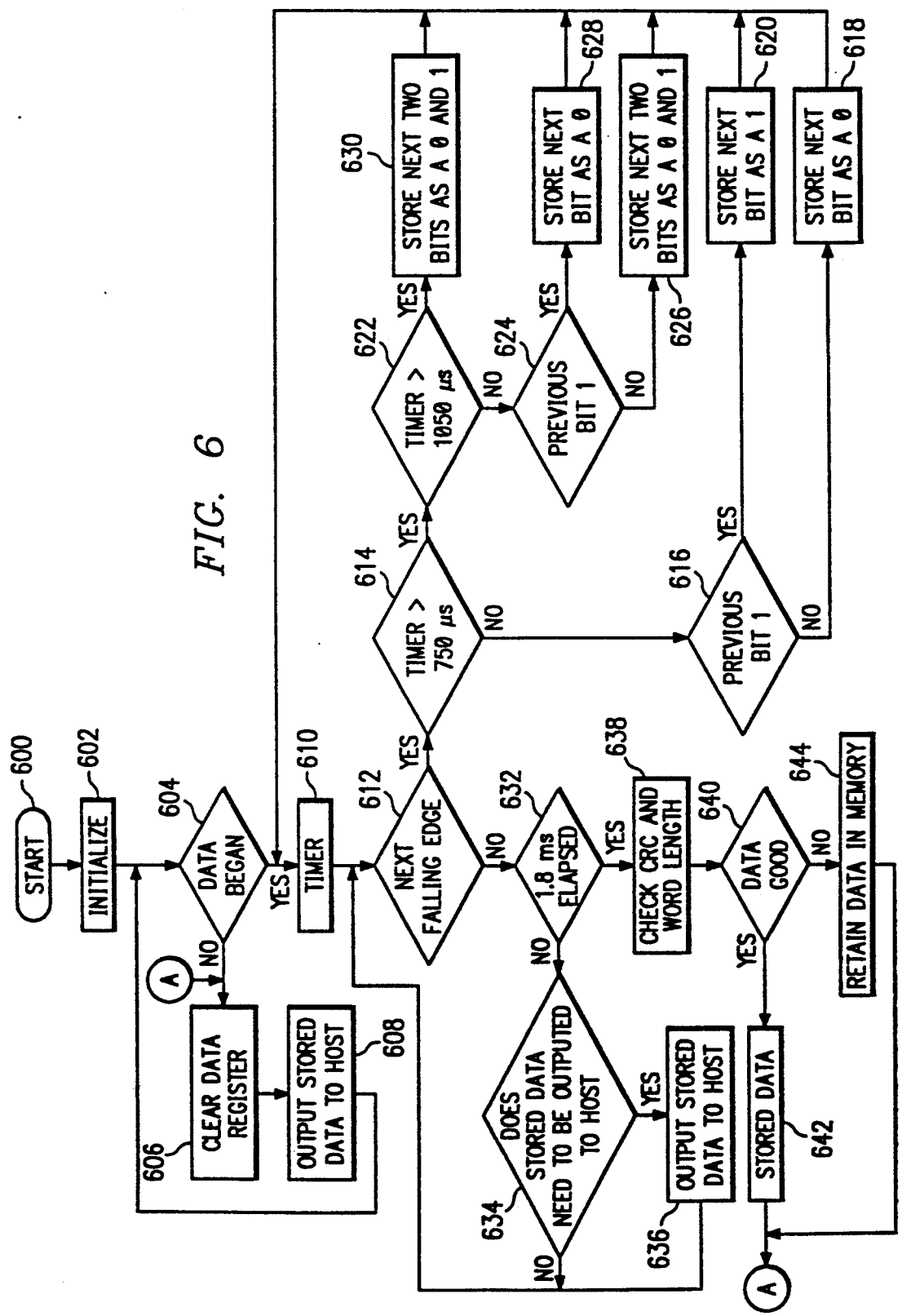

INFRARED TRANSMITTER AND RECEIVER AND METHOD

BACKGROUND OF THE INVENTION

The present invention relates in general to remote control systems employing infrared light transmitters and receivers as a means of wireless communication, and particularly to a means to eliminate cross talk and interference between multiple transmitters.

Infrared transmitters and receivers are used extensively in indoor remote-control applications, such as in the remote control of audio and video entertainment systems. A typical infrared remote control system includes a single transmitter for the encryption, modulation, and transmission of control information, and a receiver for the reception, demodulation, and decoding of the transmitted signal, all for the control of a remote device. The transmitter is a remote, hand-held, wireless device that communicates with the receiver using infrared light signals. The receiver is connected electronically to one or more devices.

A limitation of known infrared remote control systems is that the simultaneous use of more than one transmitter device in association with a single receiver can result in cross-talk or interference between the transmitted signals, adversely affecting the ability of the receiver to implement properly the desired control function.

One solution to the problem is to stagger the data within each signal sent by the transmitters. The staggering of data allows reception of the signals substantially simultaneously with each other without data interference. However, data is encoded in order to preserve it during transmission, then decoded via decoding means such as look-up tables before transmission to the device. The look-up table requires added memory, added processing steps, and added time before the proper signal is finally directed to the device.

Accordingly, what is needed is a multiple transmitter, single receiver combination that requires a minimum amount of memory, fewer processing steps, and less time for operation than is presently available.

SUMMARY OF THE INVENTION

The foregoing problems are solved and a technical advance is achieved by method and apparatus for wireless transmission of data in which two or more separate transmitter devices are able to communicate simultaneously with a single receiver via infrared light control signals without interference. According to a departure in the art, this means is accomplished by means of the present invention such that interference between simultaneously transmitted signals is eliminated by interlacing control signals with quiescent periods during their transmission. In addition, the receiver unit is able to process the signals without the aid of a look-up table, or additional processing steps typically used in the literal decoding of transmitted signals. The novel processing method allows for increased speed in transmitter-receiver communication and in device operation.

In one embodiment of the invention an apparatus for transmitting control signals to a receiving device is disclosed. The apparatus uses a control signal generator for generating a signal, which has a data pattern containing multiple data blocks separated by a quiescent period unique for the control signal, and a transmitter coupled to the control signal generator for transmitting the signal. The number of data blocks (d) is determined by the number of transmitters (n) being used with the receiving device; this is $d=2^n$. The quiescent period allows the receiving device to receive at least one data block from the transmitter without interference from a second transmitter's signal having a second unique quiescent period. Typically, the quiescent period for the second signal is a multiple value, preferably two, of the quiescent period for the first signal and the signals are infrared signals.

In another embodiment, a receiver apparatus, capable of use with at least one device, is disclosed. Each transmitter can transmit a signal having a unique pattern. Each signal contains multiple data blocks separated by a quiescent period unique for that signal. When the plurality of signals are received by the receiver substantially simultaneously with each other, the quiescent period allows the receiver to separate at least one data block from each transmitter without overlap from any data blocks from the other transmitters. The receiver has a signal detector, which detects the transmitted signals, and a controller coupled to the signal processor for validating the transmitted signals received by the signal detector based on validation information such as parity structure. A storage means, such as, for example, an 8-bit register, is used with the receiver to hold each transmitted signal before outputting them to the device.

A system protocol is also disclosed, which is used for sending signals from a transmitter to a receiving device via wireless transmission. The protocol operates first by generating a control signal containing multiple data blocks and a quiescent period unique for the control signal. Then, the protocol begins transmitting the control signal to the receiving device. Once the control signal has been received, the protocol then identifies at least one data block in the control signal transmitted from the transmitter. The quiescent period is established in such a manner as to allow at least one data block to be identified in the event that at least a second control signal with a second unique quiescent period is received by the receiving device substantially simultaneously with the control signal.

A method for allowing at least one signal transmitter to operate a single device is also disclosed. The method comprises the steps of generating a control signal comprising a plurality of data blocks interspersed with quiescent periods, transmitting the control signal to the receiver, detecting, substantially simultaneously, a plurality of signals at the receiver, identifying the data blocks from each transmitter, regardless of interference from other signals, and then validating the control signal to determine its accuracy. In addition, the signals are stored as data blocks before sending the data blocks to the device. The detecting process is actually the separation of the signals from each other and from any background interference caused by stray signals.

BRIEF DESCRIPTION OF THE DRAWINGS

FIG. 6 is a flow chart of the control logic used in decoding the received data stream from two simultaneous infrared transmissions.

DETAILED DESCRIPTION OF THE PREFERRED EMBODIMENT

In general, the simultaneous use of two or more infrared light (IR) transmitters leads to interference between control signals and the destruction of the control information. However, the present invention enables the simultaneous use of two or more transmitters with a single receiver despite the presence of cross-talk or interference between signals transmitted simultaneously from more than one transmitter. While two IR transmitters are used in an illustrative example, several IR transmitters could be used without departing from the spirit and scope of the present invention.

Figure 1:
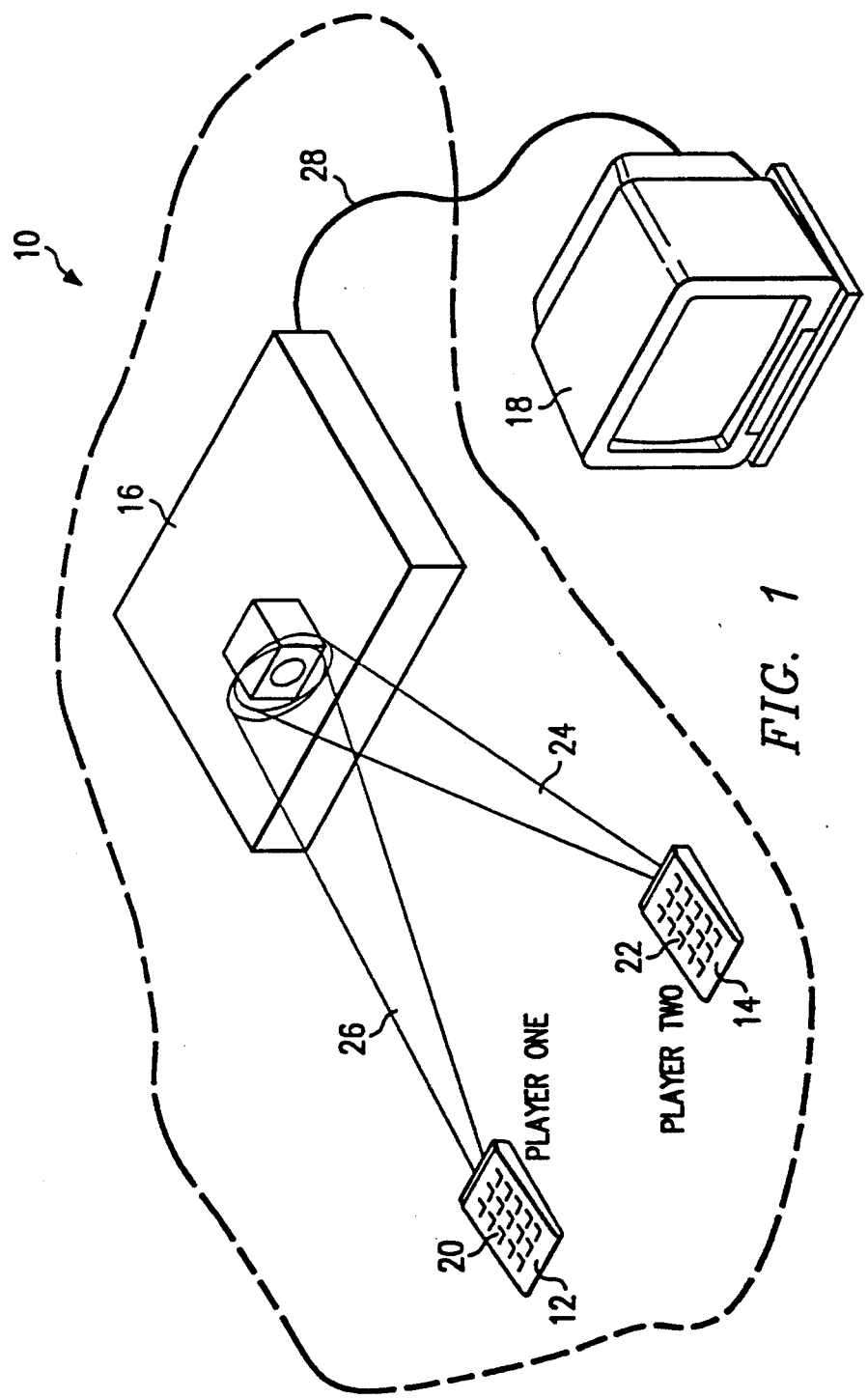
FIG. 1 is a perspective view illustrating an infrared remote-control system of the present invention connected to a remote device.

In FIG. 1 of the drawings, the reference numeral 10 designates an infrared remote-control system illustrating the general organization and embodying principles of the present invention. In one embodiment, system 10 includes a plurality of physically identical infrared remote-control transmitters. By way of example, system 10 includes a transmitter 12 for a first player, a transmitter 14 for a second player, and an IR receiver control unit 16. The unit 16 controls a system 18 connected to the unit by a cable 19. The system 18 is as an audio or video entertainment system, multimedia game player, computer, appliance, security or other type system capable of employing more than one remote control device. The IR transmitters 12 and 14 have keyboards 20 and 22, respectively, which provide the operators with means to interact with the system 18. Information regarding which key has been pressed is encoded by the IR transmitters 12 and 14, and relayed to the remote receiver unit 16 by means of IR light beams 24 and 26, respectively. The receiver unit 16 is capable of the substantially simultaneous reception of both control beams 24 and 26 as discussed in detail below. The receiver 16 converts the IR light beams 24 and 26 into an electrical signal, which is subsequently demodulated, decoded, and converted into serial data. The serial data is subsequently outputted to the host system 18 by means of the cable 19 for controlling functions of the system.

Figures 2, 2A:
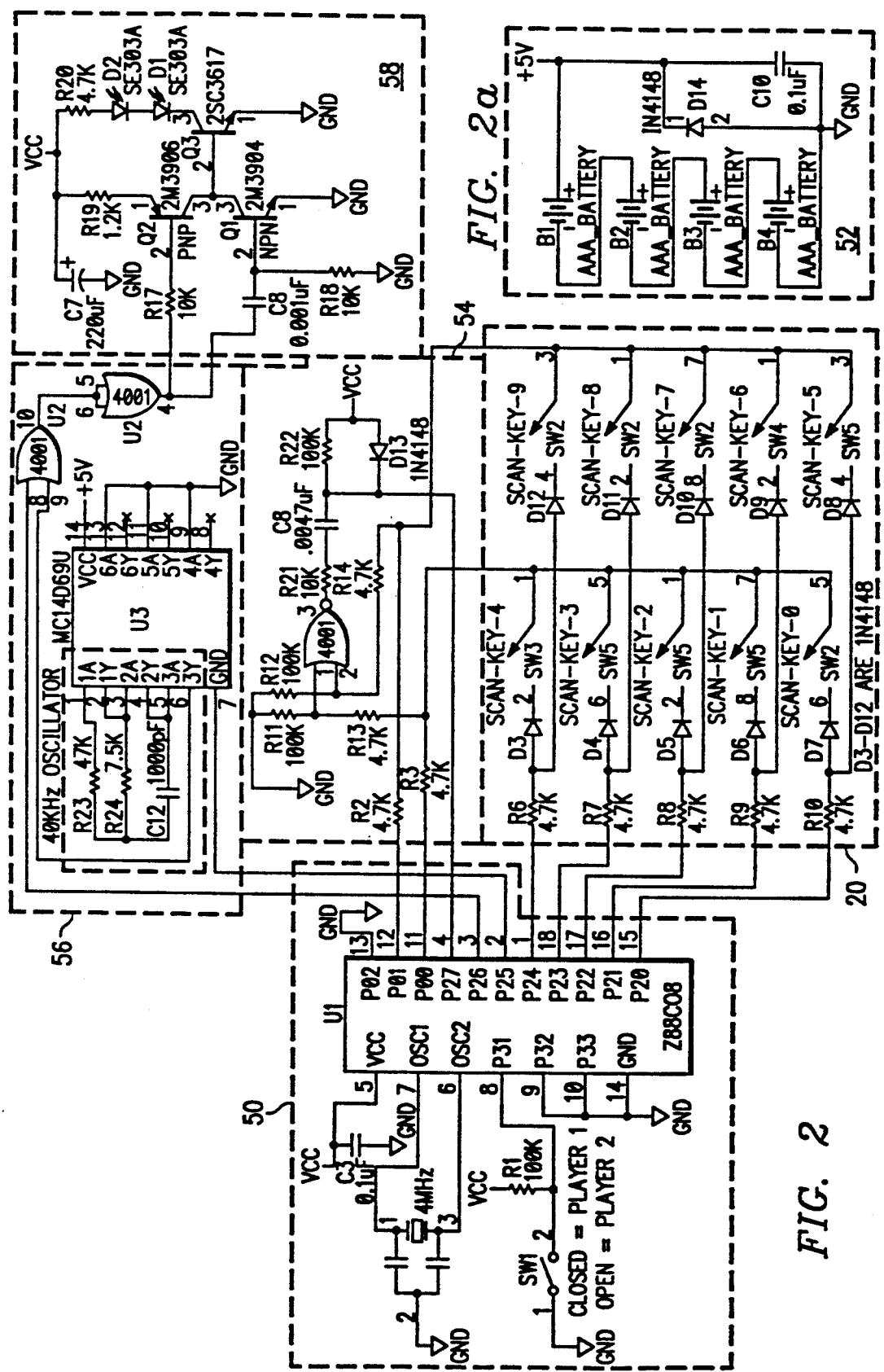
FIG. 2 is a schematic of the remote control unit, which includes a microcontroller, a keyboard, a pulse generator, a signal modulator, awake-up pulse generator, a power supply (FIG. 2A), and an infrared transmitter.

FIG. 2 of the drawings shows a schematic of the IR remote-control transmitter unit 12, which includes a microcontroller (e.g., a Z86C08 manufactured by Zilog) 50, a keyboard 20, a power supply 52 (FIG. 2A), a wake-up pulse generator 54, a signal modulator 56, and an IR transmitter 58. The unit 12 is used in the remote transmission of user control information. Control information is entered into the unit 12 via keyboard 20. The keyboard 20 provides the user with a means to interface and interact with the system 18. The keyboard data is formatted into a serial bit stream by the microcontroller 50. The modulator 56 adds a carrier wave from between 38-kiloHertz (kHz) to 44 kHz, with 38 kHz preferred, to the serial bit stream and the modulated signal is outputted to the receiver unit 16 by means of the transmitter 58.

The operation of unit 12 is initiated by the momentary depression of any of the ten switches within the keyboard 20, which action will activate the pulse generator 54. Upon activation, the pulse generator 54 generates an activation pulse, which is sent to the microcontroller 50. The microcontroller 50 then activates the rest of the transmitter unit 12. The pulse generator 54 allows the transmitter unit 12 to shut-down when not in use and conserve battery power. Subsequent to the wake-up pulse, the microcontroller 50 will strobe the keyboard 20 and determine which key has been pressed. The keyboard information is encoded and formatted by the microcontroller 50 and outputted to the signal modulator 56, which adds a 38-kHz carrier to the output signal. The modulated signal is then amplified and used to drive IR light-emitting diodes (LEDs) 60 and 62. The IR LEDs 60 and 62 transmit the output signal to the receiver unit 16.

Figure 3:
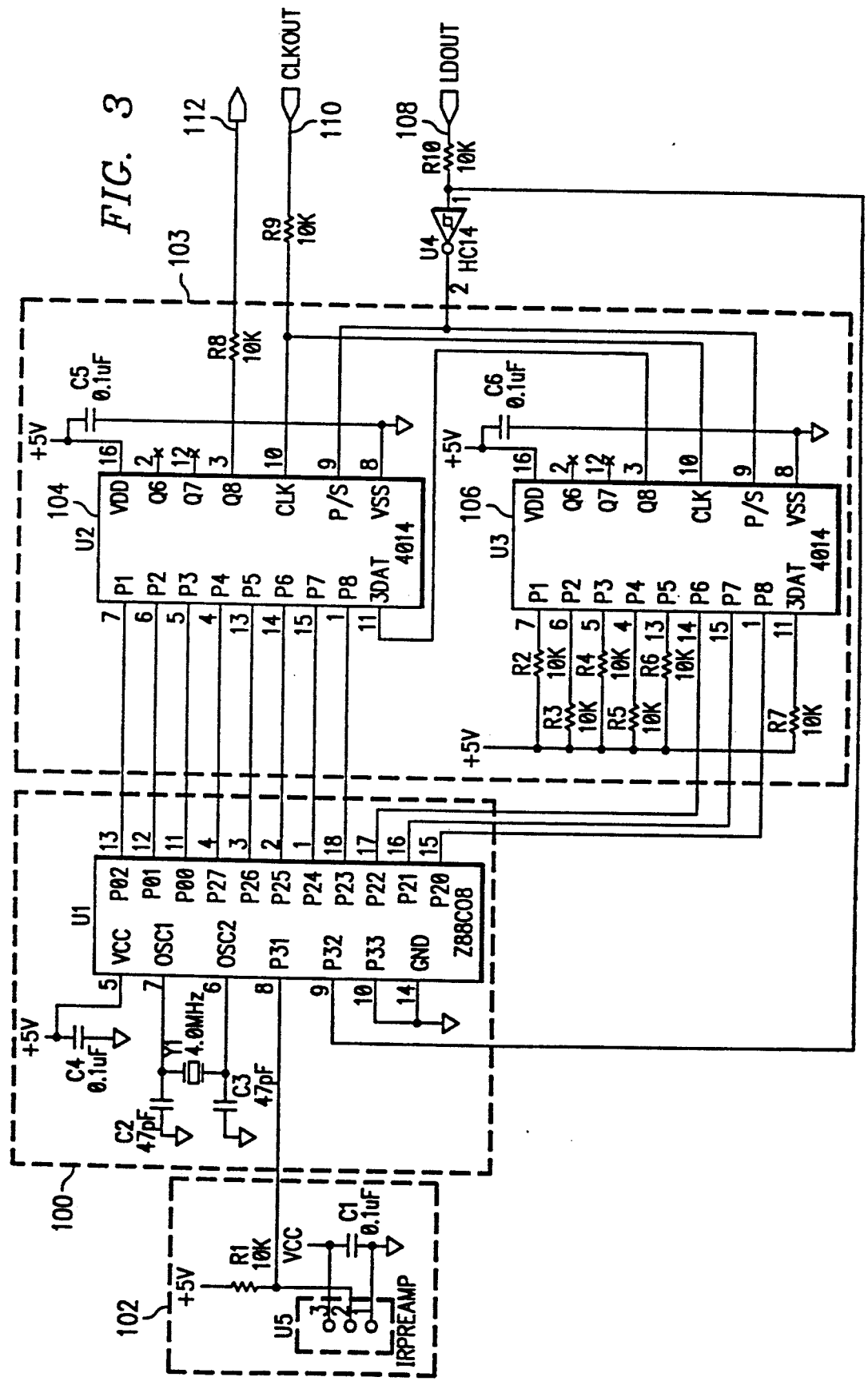
FIG. 3 is a schematic diagram illustrating the circuitry of a transmitter device of the system of FIG. 1.

FIG. 3 of the drawings shows a schematic diagram of the remote-control receiver unit 16, which includes a microcontroller (a Zilog type Z86C08) 100, an infrared detector module 102, and storage 103 using two 8-bit shift registers 104 and 106. The receiver unit 16 is utilized in the reception, demodulation and decoding of the IR control signals 24 and 26, for the control of the remote system 18.

The transmitted data is received by the IR detector module 100. The IR detector module 102 detects, amplifies, and demodulates the transmitted signals 24 and 26. The demodulated signal is inputted to the microcontroller 100 where it is decoded. After the data represented by a signal 24 or 26 is decoded, it is checked for word length, parity, and bit drop-out errors. If the data is verified as being correctly received, it will be stored in one of the microcontroller's internal registers until such time as the Load-Output (LDOUT) line 108 from the host system 18 goes low. When the LDOUT line 108 goes low, the microcontroller 102 loads the data into the shift registers 104 and 106. The shift registers 104 and 106 are used to format the data into a serial bit stream. When the LDOUT line 108 goes high again and the host clock signal (CLKOUT) is present on CLKOUT line 110, the current data will thus be clocked out to the system 18 in a serial manner. The serial data stream is transmitted from the receiver unit 16 by means of the serial data output line (DIN) 112. The LDOUT line 108, CLKOUT line 110, and the DIN line 112 compose the cable 19 of FIG. 1.

Figure 4:
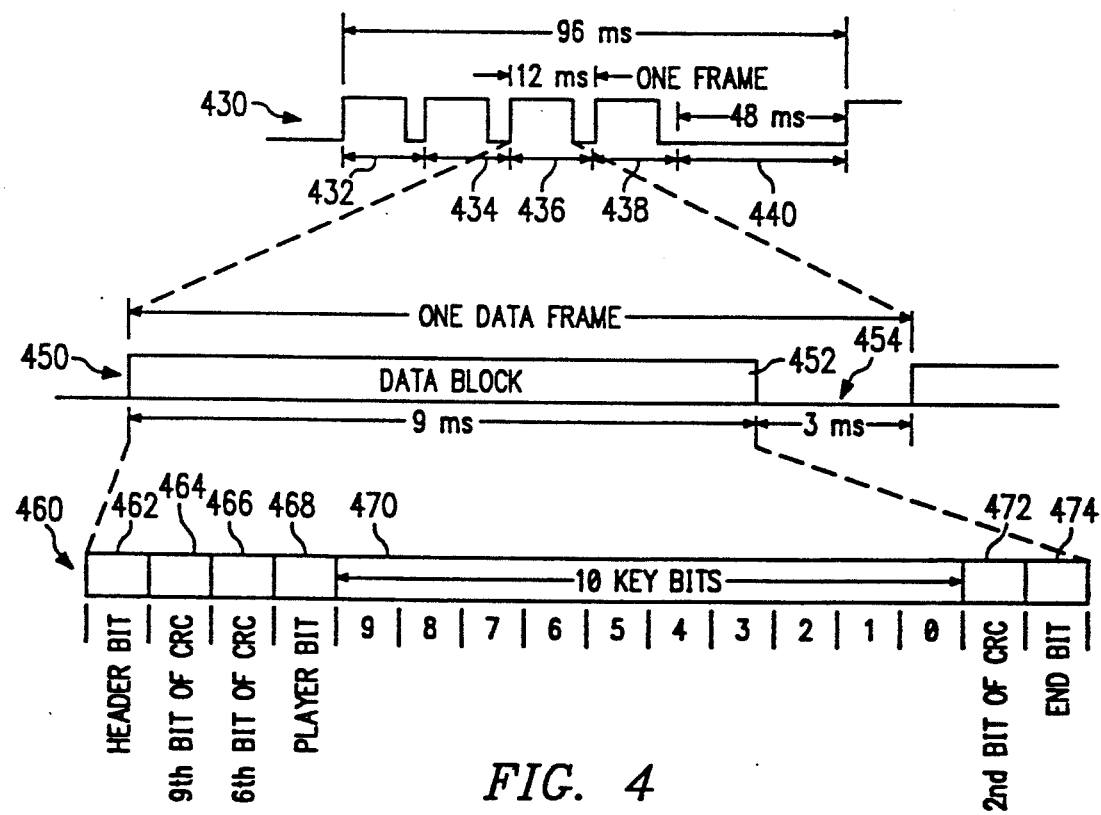
FIG. 4 is a timing diagram illustrating the data format of the transmitted controller information.

FIG. 4 of the drawings depicts timing diagrams illustrating the message format of the transmitted remote-control information. The transmission pattern for the transmitter 410 (player one) is plotted with respect to time on line 410 and is composed of four identical data frames 412, 414, 416 and 418, each of 12-milliseconds (ms) duration and interlaced with two pauses 420 and 422, each of 24-ms duration, between data frame pairs. Similarly, the transmission format for the transmitter 14 (player two) is shown on line 430 and is composed of four identical data frames 432, 434, 436 and 438, each of 12-ms duration. The four consecutive data frames 432–438 in line 430 are followed by a single pause 440 of 48-ms duration. The transmission patterns 410 and 430 are for players one and two, respectively, and are each 96-ms in duration.

In accordance with the present invention, the pauses 420, 422 and 440 provide quiescent periods in which interference between transmitters 12 and 14 cannot occur. By interlacing the data frames with quiescent periods, at least one frame of data from both transmitters will arrive at the receiver without interference from the other transmitter, regardless of when the transmissions start relative to one another. The number of transmitters used determines the number of data blocks necessary to avoid interference. The number of data blocks (d) is two (2) to the number of transmitters (n), or $d = 2^n$. For example, the present description has been limited to the use of two transmitters with signal packets containing four data blocks. If three transmitters were used, then each signal would require eight data blocks.

Line 450 illustrates the composition and timing relationship of a representative data frame, which may be any one of the data frames 432-438. The data frame 450 includes a data block 452 of 9-ms duration followed by a pause 454 of 3-ms duration. Line 460 further illustrates the composition of each data block 452. The data block 452 is composed of either 14 or 15 data bits, each of 600-microseconds duration. The first bit in the data block 452 is the header bit 462. The header bit 462 is used to signify the beginning of a data block. The second and third bits, 464 and 466 are respectively the ninth and the sixth bit of the cycle redundancy check (CRC), as will be discussed. Player bit 468 denotes which remote-control transmitter, 12 or 14, is currently transmitting. The following 10 bits 470 indicate which key, or key combination, is currently being pressed. Bit 472 is the second bit of the cycle redundancy check. The last bit is the end bit 474, which is present to provide a negative edge to the receiver unit 16, thereby signalling the end of the data block 462 and, consequently, the value (zero) of the second parity bit 472. The end bit 474 is set to a value of one when the second parity bit 472 is zero, giving the data block a length of 15 bits. The end bit 474 is not set when the value of the second parity bit 472 is one.

Bits 464, 466 and 472 together form the parity bits, which are calculated using a cycle redundancy check (CRC). The ten key data bits 470 and the player bit 468 are placed in an order in which the player bit 468 is the most significant bit and the zero key data bit is the least significant bit, as illustrated by line 190 of FIG. 4. The data bits 470 are sequentially compared to the value of one, starting with the least significant bit (key 0). If the data bit is a zero, 02 h (hexadecimal) is added to the data, and if the data bit is a one, the data is exclusively OR-gated with 199 h (hexadecimal). This process continues until all eleven bits of the data bits 470 have been checked and a CRC has been calculated. After the CRC has been calculated, the data word is outputted to the receiver 16, as previously indicated.

Figure 5:
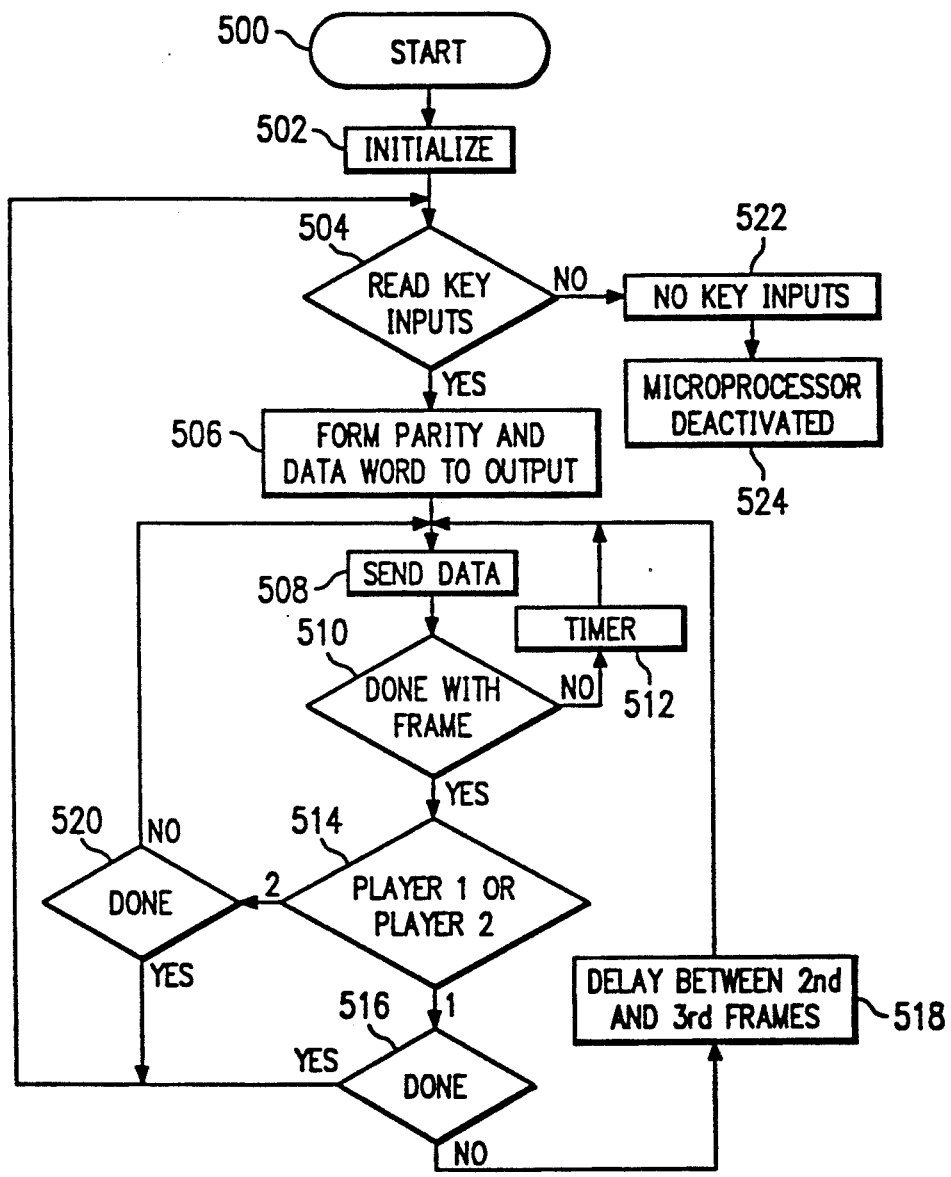
FIG. 5 is a flow chart of the control logic used in encoding the hand-controller key information to be outputted via infrared light to the infrared remote-control receiver.

FIG. 5 of the drawings shows a flow chart depicting the control logic used to encode the signals for simultaneous transmission from two transmitters 12 and 14 to the receiver unit 16. Initially, the control logic is used in the reading and de-bouncing of the keyboard 20. After determining which key(s) has been pressed, the control logic determines the required parity bits and formats the data block 462. The data blocks then are outputted to the transmitter 58. In addition, the control logic interlaces the data blocks with quiescent periods as indicated previously with respect to FIG. 4.

According to one embodiment of the present invention, a binary "one" is represented by a negative going transition, and a binary "zero" is represented by a positive going transition Each bit is 600 microseconds long; therefore, a binary "one" is composed of a 300 microsecond high, followed by a 300 microsecond low. Similarly, a binary "zero" is composed of a 300 microsecond low, followed by a 300 microsecond high. This type of logic is used because it uses fewer transitions to encode the data, thereby allowing the data to be processed in a minimum amount of time compared to more sophisticated logic schemes using a greater number of transitions per logic value.

Again referring to FIG. 5 of the drawings, the control logic begins in step 500 with power application to the transmitter 12. In step 502, all ports and registers are initialized. It is understood that the microcontroller 50 will then deactivate the transmitter 12 to conserve batteries. The transmitter 12 remains deactivated until a key is pressed. Once a key is pressed in step 504, the IR transmitter 12 is reactivated, and the microcontroller 50 begins to de-bounce the keys by strobing the keyboard 20. Strobing of the keyboard 20 begins by enabling the appropriate pin of the appropriate port of the microcontroller 50 (FIG. 2). The microcontroller 50 reads the appropriate ports in step 504 to determine if a key has been pressed and stores the key status in a register. The de-bounce process requires twenty-four-ms and forty-eight-ms for the first player and the second player, respectively. The three parity bits 464, 466, and 472 then are calculated in step 506. The key status and parity bits then are formatted into a data block 460 (FIG. 4). In step 508, the data is clocked out of the microcontroller 50 one-half bit at a time. In step 510, the first half of the data-bit is sent to the modulator 58. If, in step 510, the frame is not completely outputted, then the microcontroller 50 waits in step 512 for 300 microseconds, after which, the next half bit is transmitted (step 510). In this manner the data block is clocked-out of the microcontroller 50 until the transfer of the data block is completed.

At the end of each data block 452, a quiescent period of 3-ms is added to form a single data frame. The 3-ms quiescent periods are formed by outputting five (5) straight bits of no transition "zeros," meaning, the waveform does not change levels. After outputting the data frame to the IR transmitter 58, step 514 of the control logic determines which transmission format, for player one or two, is to be used.

If in step 516, player one has been selected, the microcontroller 50 determines if four data frames have been outputted. If the four data frames have not been outputted, the microcontroller 50 returns back to step 508 to output the next data frame via step 518, which provides a twenty-four-ms delay between the second and third frame of data. If four frames of data have been outputted, the microcontroller 50 returns to step 504 where the keys are again scanned and de-bounced.

If player two has been selected in step 520, the microcontroller 50 determines if all four data frames have been outputted. If the output has not been completed, the microcontroller 50 returns to step 508 to output the next data frame. If all four data frames have been outputted, the microcontroller 50 returns to step 504 where the keys again are scanned and de-bounced. If the keys are scanned and it is determined that no keys have been pressed (step 504), a frame of data is sent signifying that the key or keys previously depressed are no longer depressed (step 522), thereafter deactivating (step 524) the microprocessor 50.

FIG. 6 of the drawings shows a flow chart depicting the control logic used to implement the simultaneous signal reception from the two transmitters 12 and 14 by the receiver 16 (FIG. 1). The receiver control logic is used in decoding the transmitted data blocks, performing parity and word length checks, and in outputting the sampled data block to the host system 18 (FIG. 1). In actuality, the decoding is a signal validation, rather than a literal decoding operation.

The receiver control logic begins in step 600 when power is applied to the receiver 16. In step 602, the registers and ports of the microprocessor 100 are initialized and a timer is set for 96-ms. In step 604, a determination is made whether the data has been received. If no data is received within 96-ms, then in step 606 the data register is cleared. In step 608 the data is outputted to signify the absence of new data. Execution then returns to step 604, where the receiver 16 again determines waits the detection of the first falling edge in the data stream. If in step 604 a falling edge is detected, in step 610, a timer is initialized to start counting. In step 612 a determination is made whether the next falling edge is detected. If so, in step 614 the value of the timer is examined. If in step 614 the value of the timer is less than 750 microseconds (Ms), the control logic proceeds to step 616. If, in step 616 the previous bit was a zero, then, in step 618, the next bit is stored as a zero. If in step 614 the time is less than 750-Ms and the previous bit in step 616 is a one, then in step 620 the next bit is stored as a one.

If in step 614 the timer is 750-Ms or longer, the control logic proceeds to step 622. If the timer is less than 1050 ms in step 624 a determination is made whether the previous bit was a one. If not, then in step 626 the next two bits are stored as a zero and one. If, in step 624, the previous bit was a one, then in step 628 the next bit is stored as a zero. If, in step 622 the timer is over 1,050-Ms, then in step 630 the next two bits are stored as a zero and a one.

After the value of the previous bit and the timer count are examined in steps 614–630, execution returns to step 610 and the microprocessor 100 re-initializes the timer and in step 612 waits for the next falling edge. When the next falling edge is detected, the process, as previously outlined in steps 614–630, is repeated.

If, in step 612 no falling edge is detected, execution proceeds to step 632 to determine if before 1.8-ms have elapsed the microprocessor 100 determines if the data needs to be outputted to the host. If in step 634 the determination is yes, then in step 636 the data are outputted to the host. Afterwards, or if no in step 634, the execution of the microprocessor returns to step 612 and awaits the next falling edge.

If 1.8-ms have elapsed, then in step 638 the CRC parity and the word length are checked. In step 640 a determination is made whether the data are good. If so, in step 642 they are stored in memory. If the data are not good in step 640, then in step 644 the current contents of the memory are retained.

Microprocessor 100 then determines if the data need to be outputted to the host in step 606. If yes, the data are outputted in step 608. Afterwards, or if the data need not be outputted (step 606) the control logic returns to step 604. When the next falling edge in the data stream is detected, the process of decoding the received data will be repeated.

After a key or keys are released, and no other keys are activated, the remote sends a data frame to the receiver to signify that the keys are no longer being activated. This is done before the microcontroller goes into "sleep" mode, and thus tells the host that the key status most recently received is no longer valid.

It is understood that when only one player is using the apparatus, only a single remote interacts with the receiver by transmitting data. The same procedure is used to transmit and receive data; however, the data block need be sent only once, rather than four times. This allows a single player to interact more rapidly with the receiver by allowing more key activations per second.

There has been described a novel infrared transmitter and receiver system and method. It is evident that those skilled in the art may now make numerous uses and modifications of and departures from the specific embodiments described herein without departing from the inventive concept. Consequently, the invention is to be construed as embracing each and every novel combination of features present in or possessed by the apparatus, method, and protocol herein disclosed.

What is claimed is:

1. An apparatus for transmitting control signals to a receiving device for operating a video system, comprising:
   a control signal generator for generating a control signal having a data pattern containing multiple identical data blocks interspersed with quiescent periods, said multiple data blocks being arranged in a pattern unique for the control signal and each of the data blocks being of a predetermined length for receipt by the receiver, with each control signal further including validation information to enable signal validation by the receiver; and,
   a transmitter coupled to the control signal generator for transmitting the signal, wherein the unique pattern allows the receiving device to receive at least one data block from the transmitter without interference from signals from at least one other transmitter.

2. The apparatus of claim 1 wherein the control signal generator is a microprocessor.

3. The apparatus of claim 2 wherein the microprocessor is programmed to generate a $2^n$ data burst of data blocks, wherein n is greater than or equal to one (1).

4. The apparatus of claim 3 wherein the number n represents a total number of transmitters used with the receiving device.

5. The apparatus of claim 2 wherein the microprocessor is programmed to generate the signal validation information represented as parity structure.

6. The apparatus of claim 1 further comprising an infrared signal generator for generating infrared signals in response to the signals generated by the control signal generator for transmission by the transmitter.

7. An apparatus for receiving control signals for operating a video system, comprising:
   a signal detector for detecting the control signals sent by a plurality of signal transmitting devices; and,
   a signal decoder coupled to the signal detector for decoding and validating the control signals in a manner that identifies one signal from another, wherein each control signal has a data pattern containing multiple data blocks interspersed with quiescent periods being arranged in a pattern unique for that control signal, each of the data blocks being of a predetermined length for receipt by the receiving apparatus, and with each control signal further including validation information to enable signal validation by the receiving apparatus.

8. The apparatus of claim 7 wherein the signal decoder is a microprocessor.

9. The apparatus of claim 8 wherein the microprocessor is programmed to identify the data block based on its predetermined length.

10. The apparatus of claim 9 wherein the microprocessor is further programmed to validate the control signal based on a parity structure contained within the control signal.

11. The apparatus of claim 7 further comprising a storage means coupled to the signal decoder for storing each transmitted signal after validation and before being outputted to the video system.

12. The apparatus of claim 11 wherein the storage means is an 8-bit register.

13. The apparatus of claim 7 wherein at least n number of transmitters are capable of substantially simultaneous operation with the receiving apparatus and wherein the control signal generated by each transmitter comprises at least $2^n$ data blocks, where n is greater than or equal to one (1), in a pattern unique for that control signal thereby allowing the receiver to decode each control signal received and identify at least one data block from each transmitter.

14. The apparatus of claim 7 further comprising means for detecting infrared signals.

15. A method for allowing one signal receiver and a plurality of signal transmitters to operate a video system, comprising the steps of:
   in each transmitter, generating a control signal having a data pattern containing multiple identical data blocks arranged in a pattern unique for that transmitter, each of the data blocks being a predetermined length for receipt by the receiver and wherein the control signal further includes validation information to enable signal validation by the receiver, wherein each transmitter operates on the same frequency;
   transmitting the control signal from at least one transmitter to the receiver;
   detecting the transmitted control signal by the receiver;
   identifying, in the control signal, at least one data block based on its predetermined length;
   validating the control signal based on the validation information in the control signal to determine its accuracy.

16. The method of claim 15 wherein the step of validating the control signal includes the steps of:
   checking validation information for a parity structure; and then,
   matching the parity structure against the data block to determine its correctness.

17. The method of claim 15 further comprising the steps of:
   storing the validated data block;
   sending the stored validated data block to the video system.

18. The method of claim 15 wherein at least n number of transmitters are capable of substantially simultaneous operation with the receiver and wherein the control signal generated by each transmitter comprises at least $2^n$ data blocks, where n is greater than or equal to one (1), in a pattern unique for that control signal thereby allowing the receiver to decode each control signal received and identify at least one data block from each transmitter.

19. The method of claim 18 wherein the uniqueness of each control signal is determined by a unique quiescent period interspersed with the data blocks.

20. The method of claim 15 wherein the control signal is infrared signals.

* * * * *